US006794310B1

(12) United States Patent
Miller et al.

(10) Patent No.: US 6,794,310 B1
(45) Date of Patent: Sep. 21, 2004

(54) METHOD AND APPARATUS FOR DETERMINING TEMPERATURE OF A SEMICONDUCTOR WAFER DURING FABRICATION THEREOF

(75) Inventors: Gayle W. Miller, Colorado Springs, CO (US); Todd A. Randazzo, Colorado Springs, CO (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/952,540

(22) Filed: Sep. 14, 2001

Related U.S. Application Data

(62) Division of application No. 09/395,507, filed on Sep. 14, 1999, now Pat. No. 6,328,802.

(51) Int. Cl.[7] .............................................. H01L 21/66
(52) U.S. Cl. .......................... 438/760; 438/14; 438/17; 438/18
(58) Field of Search ............................ 438/17, 18, 14, 438/760

(56) References Cited

U.S. PATENT DOCUMENTS

| | | | |
|---|---|---|---|
| 4,535,638 A | | 8/1985 | EerNisse et al. |
| 4,772,130 A | | 9/1988 | Ueda et al. |
| 5,121,067 A | * | 6/1992 | Marsland ..................... 324/637 |
| 5,378,939 A | * | 1/1995 | Marsland et al. .............. 327/91 |
| 5,511,427 A | | 4/1996 | Burns |
| 5,511,428 A | | 4/1996 | Goldberg et al. |
| 5,564,830 A | | 10/1996 | Böbel et al. |
| 5,616,518 A | | 4/1997 | Foo et al. |
| 5,639,163 A | * | 6/1997 | Davidson et al. ........... 374/178 |
| 5,639,423 A | * | 6/1997 | Northrup et al. .............. 422/50 |
| 5,645,351 A | * | 7/1997 | Nakata et al. ............... 374/161 |
| 5,706,840 A | * | 1/1998 | Schneider et al. ......... 134/56 R |
| 5,772,322 A | | 6/1998 | Burns et al. |
| 5,955,932 A | * | 9/1999 | Nguyen et al. .............. 333/186 |
| 5,977,813 A | * | 11/1999 | Boerstler ..................... 327/378 |
| 6,259,302 B1 | * | 7/2001 | Phanse et al. ............... 327/362 |

OTHER PUBLICATIONS

On chip temparature sensor, Aug. 1, 1993, IBM Technical Disclosure Bulletin, vol. No. 36, pp. 489–492.*

* cited by examiner

*Primary Examiner*—Matthew Smith
*Assistant Examiner*—Chuong Anh Luu
(74) *Attorney, Agent, or Firm*—Maginot, Moore & Bowman LLP

(57) ABSTRACT

A method of determining temperature of a semiconductor wafer during wafer fabrication includes the step of providing a response circuit on the semiconductor wafer. The method also includes the step of transmitting an interrogation signal with a signal transceiver so as to excite the response circuit. The method further includes the step of receiving a response signal which was generated by the response circuit as a result of excitation thereof. In addition, the method includes the step of determining temperature of the semiconductor wafer based on the response signal. Moreover, the method includes the step of fabricating a circuit layer on the semiconductor wafer. Both the transmitting step tri and the receiving step are performed contemporaneously with the fabricating step. An apparatus for determining temperature of a semiconductor wafer during wafer fabrication is also disclosed.

14 Claims, 3 Drawing Sheets

METHOD AND APPARATUS FOR DETERMINING TEMPERATURE OF A SEMICONDUCTOR WAFER DURING FABRICATION THEREOF

This application is a divisional of application Ser. No. 09/395,507, filed on Sep. 14, 1999, now U.S. Pat. No. 6,328,802.

TECHNICAL FIELD OF THE INVENTION

The present invention relates generally to semiconductor wafer fabrication, and more particularly to a method and apparatus for determining temperature of a semiconductor wafer during fabrication thereof.

BACKGROUND OF THE INVENTION

The manufacture of semiconductor wafers to create semiconductor integrated circuit devices typically involves a sequence of processing steps which fabricate the multi-layer structure generally associated with the integrated circuit devices. Such processing steps may include (1) the deposition of metals, dielectrics, and semiconductor films, (2) the creation of masks by lithography techniques, (3) the doping of semiconductor layers by diffusion or implantation, (4) the polishing of outer layers (e.g. chemical-mechanical polishing), and (5) the etching of layers for selective or blanket material removal.

It should be appreciated that it is generally necessary to maintain relatively precise control of the temperature of a semiconductor wafer during performance of certain of the processing steps associated with manufacture of the wafer. For example, a number of processing steps associated with wafer fabrication involve complex chemical reactions which require the temperature of the semiconductor wafer to be controlled within predetermined specifications. To this end, a number of concepts have heretofore been developed to measure the temperature of a semiconductor wafer during wafer fabrication.

For example, temperature sensors are utilized within a chamber or the like in which the semiconductor wafer is located in order to measure the temperature if the air or other gas within the chamber. The temperature of the semiconductor wafer is then estimated or otherwise derived from the temperature of the air or other gas within the chamber. Moreover, thermocouples have heretofore been secured to a chuck or other type of wafer handling device in order to measure the temperature of the handling device. The temperature of the semiconductor wafer is then estimated or otherwise derived from the temperature of the handling device.

However, such heretofore designed concepts have a number of drawbacks associated therewith. For example, both aforementioned concepts (i.e. use of the temperature sensors within a chamber or thermocouples on a handling device) determine the temperature of the semiconductor wafer indirectly. In particular, both aforementioned concepts require that the temperature of the semiconductor wafer be estimated or otherwise derived from a temperature measurement that is not taken directly from the wafer.

In an attempt to overcome the drawbacks of indirect temperature measurement, a number of concepts have heretofore been developed in an attempt to directly measure the temperature of a semiconductor wafer. For example, optical pyrometers have heretofore been utilized in an attempt to directly measure the temperature of a semiconductor wafer during wafer fabrication. However, use of optical pyrometers has typically not produced consistent measurements due to variations in wafer emissivity.

What is needed therefore is a method and apparatus for determining the temperature of a semiconductor wafer during fabrication thereof which overcomes one or more of the aforementioned drawbacks. What is particularly needed is a method and apparatus for measuring temperature of a semiconductor wafer which measures the temperature of the wafer directly. What is further needed is a method and apparatus for measuring temperature of a semiconductor wafer which measures the temperature of the wafer in-situ.

SUMMARY OF THE INVENTION

In accordance with a first embodiment of the present invention, there is provided a method of determining temperature of a semiconductor wafer during wafer fabrication. The method includes the step of providing a response circuit on the semiconductor wafer. The method also includes the step of exciting the response circuit and measuring an output response thereof. Moreover, the method includes the step of determining temperature of the semiconductor wafer based on the output response of the response circuit. The method yet further includes the step of fabricating a circuit layer on said semiconductor wafer. The exciting step is performed contemporaneously with the fabricating step.

In accordance with a second embodiment of the present invention, there is provided an apparatus for determining temperature of a semiconductor wafer during wafer fabrication. The semiconductor wafer has a response circuit. The apparatus includes a signal transceiver for (i) transmitting an interrogation signal which excites the response circuit, and (ii) receiving a response signal generated by the response circuit as a result of excitation thereof. The apparatus also includes a processing unit which is electrically coupled to the signal transceiver. The apparatus also includes a memory device electrically coupled to the processing unit. The memory device has stored therein a plurality of instructions which, when executed by the processing unit, causes the processing unit to (a) operate the signal transceiver to (i) transmit the interrogation signal so as to excite the response circuit during fabrication of the semiconductor wafer, and (ii) measure the response signal generated by the response circuit, and (b) determine temperature of the semiconductor wafer based on the response signal of the response circuit.

In accordance with a third embodiment of the present invention, there is provided a method of determining temperature of a semiconductor wafer during wafer fabrication. The method includes the step of providing a response circuit on the semiconductor wafer. The method also includes the step of transmitting an interrogation signal with a signal transceiver so as to excite the response circuit. The method further includes the step of receiving a response signal which was generated by the response circuit as a result of excitation thereof. In addition, the method includes the step of determining temperature of the semiconductor wafer based on the response signal. Yet further, the method includes the step of fabricating a circuit layer on the semiconductor wafer. Both the transmitting step and the receiving step are performed contemporaneously with the fabricating step.

In accordance with a fourth embodiment of the present invention, there is provided a method of determining temperature of a semiconductor wafer during wafer fabrication. The method includes the step of providing a response circuit on the semiconductor wafer. The method also includes the step of exciting the response circuit and measuring an output response thereof. Moreover, the method includes the step of determining temperature of the semiconductor wafer based on the output response of the response circuit.

It is therefore an object of the present invention to provide a new and useful method of determining temperature of a semiconductor wafer during fabrication thereof.

It is moreover an object of the present invention to provide an improved method of determining temperature of a semiconductor wafer during fabrication thereof.

It is also an object of the present invention to provide a new and useful apparatus for determining temperature of a semiconductor wafer during fabrication thereof.

It is moreover an object of the present invention to provide an improved apparatus for determining temperature of a semiconductor wafer during fabrication thereof.

It is yet another object of the present invention to provide a method and apparatus for determining temperature of a semiconductor wafer during fabrication thereof which measures temperature of the wafer in-situ.

It is moreover an object of the present invention to provide a method and apparatus for determining temperature of a semiconductor wafer during fabrication thereof which is more accurate relative to heretofore designed systems.

It is also an object of the present invention to provide a method and apparatus for determining temperature of a semiconductor wafer during fabrication thereof which does not rely on estimated temperature data.

The above and other objects, features, and advantages of the present invention will become apparent from the following description and the attached drawings.

DETAILED DESCRIPTION OF THE INVENTION

Figure 1:
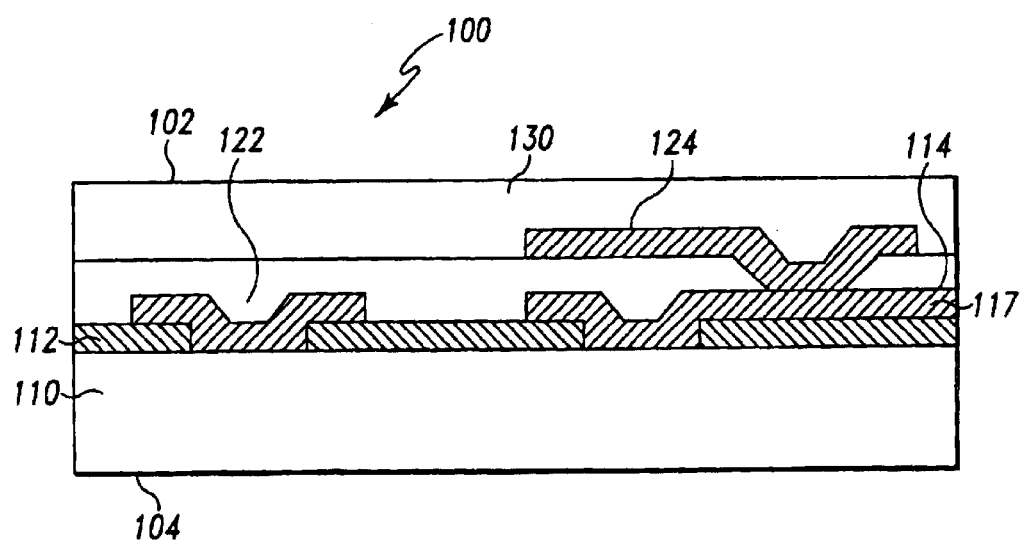
FIG. 1 is a cross sectional view of a semiconductor wafer which describes various steps of a wafer fabrication process.

While the invention is susceptible to various modifications and alternative forms, specific embodiments thereof have been shown by way of example in the drawings and will herein be described in detail. It should be understood, however, that there is no intent to limit the invention to the particular forms disclosed, but on the contrary, the intention is to cover all modifications, equivalents and alternatives falling within the spirit and scope of the invention as defined by the appended claims.

Referring now to FIG. 1, there is shown a semiconductor wafer such as an integrated circuit wafer 100. The semiconductor wafer 100 has a front side 102 and a back side 104. Typically, the semiconductor wafer 100 is constructed in layers commencing with the back side 104. An initial layer is a substrate 110 that is typically a semiconductor material such as silicon. A first insulating layer 112 is fabricated on the substrate 110, followed by a first metal layer 114. The metal layer 114 may be fabricated using known masking and deposition techniques to produce a thin film circuit element. The metal layer 114 is configured to include a contact 117 at an external surface of the wafer 100. In practice, several of such contacts 117 may be provided throughout the various metal layers of the wafer 100. Following fabrication of the first metal layer 114, a second insulation layer 122 is deposited, followed by a second metal layer 124. A final insulator or dielectric layer 130 is then fabricated on the wafer 100 thereby defining the front side surface 102.

Although the concepts of the present invention may be utilized in any wafer fabrication process which requires control of wafer temperature, specific embodiments will herein be described which include a chemical vapor deposition (CVD) process which deposits a wafer material such as a dielectric material on the wafer 100 and a chemical etching process which etches or otherwise removes wafer material from the wafer 100. However, it should be appreciated by one skilled in the art that there exists numerous other wafer fabrication processes that may incorporate features of the present invention therein.

Figure 2:
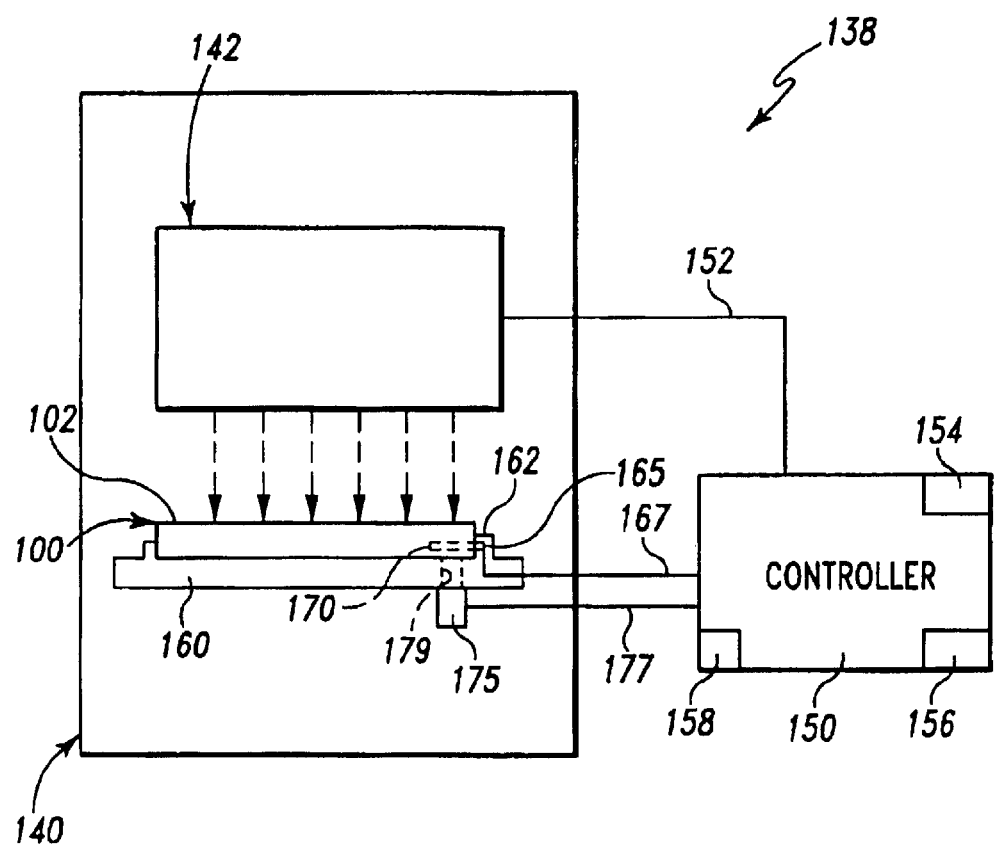
FIG. 2 is a block diagram of a thin film deposition system which incorporates the features of the present invention therein.

Accordingly, referring now to FIG. 2, there is shown a wafer fabrication device such as a material deposition device 138. The material deposition device 138 includes a deposition chamber 140 having a dispensing device 142 that produces a controlled, calibrated spray of wafer material such as dielectric layer material. A controller 150, which preferably includes a processing unit 154 and an associated memory device 156, communicates control signals via a signal line 152 to the dispensing device 142. Signals from the controller 150 determine the material deposition rate, as well as the activation and deactivation of the dispensing device 142.

The wafer 100 is supported with its front surface 102 facing the dispensing device 142 by use of a wafer carrier 160. The wafer carrier 160 is of a conventional design configured to support a particular wafer product within the deposition chamber 140. The wafer carrier 160 includes a flange 162 that abuts the side surfaces of the wafer 100 to help align and support the wafer. Preferably, the deposition chamber 140 is part of a sequential manufacturing system. Hence, the wafer carrier 160 may be configured to automatically grab and release the wafers 100 at appropriate times during the fabrication process.

As shown in FIG. 2, the semiconductor wafer 100 includes a response circuit 170 that is responsive to an external input or signal. In an exemplary embodiment, the response circuit 170 includes a resonant circuit that is responsive to an external RF interrogator signal. In a more specific embodiment the response circuit 170 includes a resonant test circuit incorporated into the first metal layer 114 of the semiconductor wafer 100. In many semiconductor integrated circuit designs, a separate test circuit is provided within the semiconductor wafer 100 for subsequent quality control testing. The response circuit 170 of the present invention may be incorporated into such a test circuit in order to monitor wafer temperature during wafer fabrication. Moreover, test or calibration wafers are commonly utilized in order to calibrate certain wafer production machines or devices in order to ensure that the wafer production machines are performing within certain specifications. The response circuit 170 of the present invention may be incorporated into such a test or calibration wafer in order to facilitate calibration of the production machine or device.

An output response or signal generated by the response circuit 170 within the semiconductor wafer 100 is communicated to the controller 150. In particular, the controller 150 includes an internal signal transceiver 158 which is coupled to a carrier contact 165 via a signal line 167 thereby electrically coupling the response circuit 170 to the controller 150. As shown in FIG. 2, the flange 162 incorporates the carrier contact 165 in order to provide an electrical connection with the contact 117 of the semiconductor wafer 100. It should be appreciated that although the embodiment described herein utilizes the carrier contact 165 mounted within the flange 162 of the wafer carrier 160, other arrangements for making connection with the response circuit 170 of the semiconductor wafer 100 are also contemplated. As shall be discussed below in greater detail, an output response signal generated by the response circuit 170 that is indicative of the temperature of the semiconductor wafer 100 is communicated to the signal transceiver 158 of the controller 150 via the signal line 167.

The response circuit 170 may be configured as a self-exciting response circuit. In particular, an input or interrogator signal may be transmitted by the signal transceiver 158 of the controller 150 via the signal line 167 in order to excite the response circuit 170. The output response of the response circuit 170 may then be returned or otherwise communicated to the signal transceiver. In such an arrangement, the signal line 167 may include a pair of electrical signal lines or may alternatively incorporate a duplexing circuit such that signals may be communicated in both directions across the same signal line.

Alternatively, the response circuit 170 may be separately excited by an external signal. In this embodiment, as illustrated in FIG. 2, a signal generator and receiver such as an external signal transceiver 175 is supported by the wafer carrier 160. In this position, the signal transceiver 175 is effectively shielded from the spray of deposition material impinging on the front surface 102 of the wafer 100. Alternatively, the external signal transceiver 175 may be embedded within the wafer carrier 160. As a further specific embodiment, the wafer carrier 160 may include a channel 179 between the signal transceiver 175 and the semiconductor wafer 100 to reduce the effects of the structure of the wafer carrier 160 on the transmitted signal. A signal line 177 electrically couples the signal transceiver 175 to the controller 150. Details of the operation of the controller 150, the signal transceiver 158, the response circuit 170, and the signal transceiver 175 will be described below.

Figure 3:
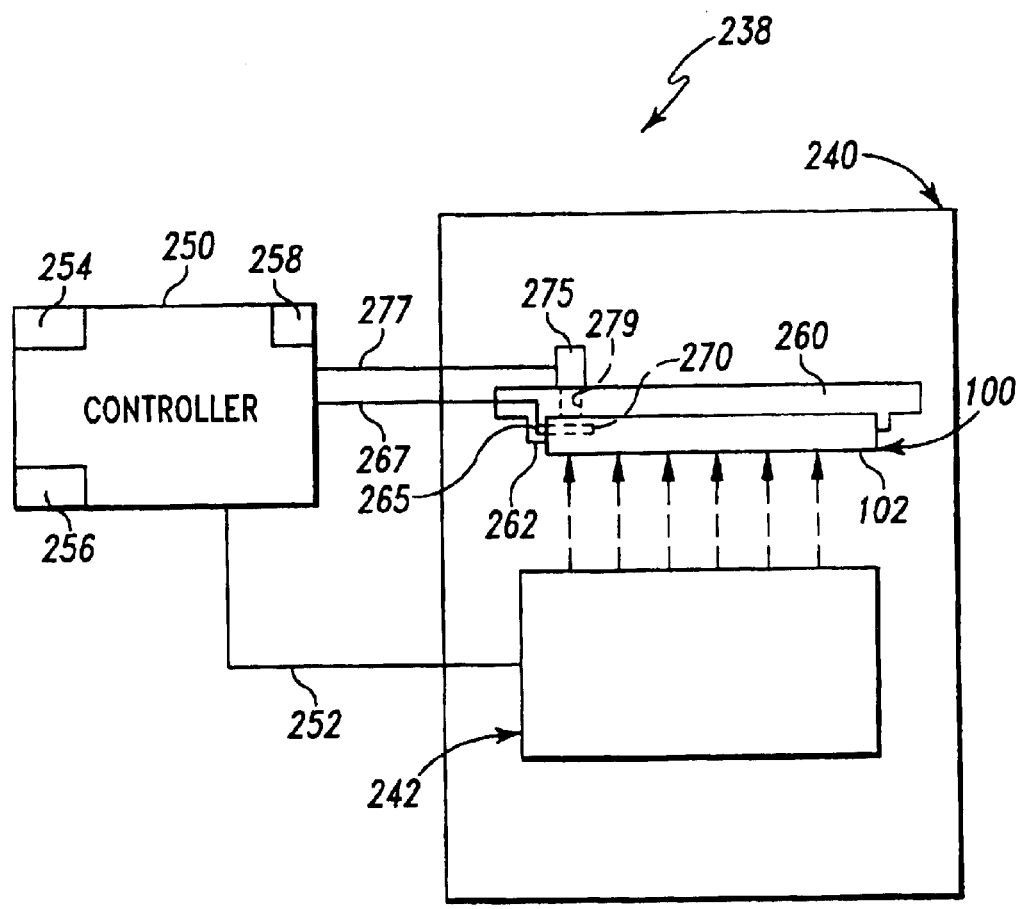
FIG. 3 is a block diagram showing an etching system that incorporates the features of the present invention therein.

The present invention also has application in determining wafer temperature as wafer material is being removed. Referring now to FIG. 3, a material removal device such as a wafer etching device 238 is shown. The wafer etching device 238 includes an etching chamber 240 having a chemical distribution device 242 positioned therein. The chemical distribution device 242 selectively releases a chemical etching material into the etching chamber 240. It should be appreciated that the wafer etching device 238 may include a plasma etching device which contains an electric field generator that selectively generates a plasma from gas present within the etching chamber 240 which selectively etches the front side 102 of the semiconductor wafer 100.

A controller 250, which preferably includes a processing unit 254 and an associated memory device 256, provides control signals via a signal line 252 to the chemical distribution device 242. Signals from the controller 250 determine the material removal rate, as well as the activation and deactivation of the chemical distribution device 242 (along with the electric field generator in the case of a plasma etching device).

The wafer 100 is supported with its front surface 102 facing the chemical removal device 242 by use of a wafer carrier 260. The wafer carrier 260 may be of a conventional design configured to support a particular wafer product within the etching chamber 240. The wafer carrier 260 may include a flange 262 that abuts the side surfaces of the wafer 100 to help align and support the wafer 100. Preferably, the etching chamber 240 is part of a sequential manufacturing system. Hence, the wafer carrier 260 may be configured to automatically grab and release the wafers 100 at appropriate times during the fabrication process.

An output response or signal generated by the response circuit 170 within the semiconductor wafer 100 is communicated to the controller 250. In particular, the controller 250 includes a signal transceiver 258 which is coupled to a carrier contact 265 via a signal line 265 thereby electrically coupling the response circuit 170 to the controller 250. As shown in FIG. 3, the flange 262 incorporates the carrier contact 265 in order to provide an electrical connection with the contact 117 of the semiconductor wafer 100. It should be appreciated that although the embodiment described herein utilizes the carrier contact 265 mounted within the flange 262 of the wafer carrier 260, other arrangements for making connection with the response circuit 170 of the semiconductor wafer 100 are also contemplated. As shall be discussed below in greater detail, an output response signal generated by the response circuit 170 that is indicative of the temperature of the semiconductor wafer 100 located within the etching chamber 240 is communicated to the signal transceiver 258 of the controller 250 via the signal line 267.

As discussed above, the response circuit 170 may be configured as a self-exciting response circuit. In particular, an input or interrogator signal may be transmitted by the signal transceiver 258 of the controller 250 via the signal line 267 in order to excite the response circuit 170. The output response of the response circuit 170 may then be returned or otherwise communicated to the signal transceiver 258. In such an arrangement, the signal line 267 may include a pair of electrical signal lines or may alternatively incorporate a duplexing circuit such that signals may be communicated in both directions across the same signal line.

Alternatively, the response circuit 170 may be separately excited by an external signal. In this embodiment, as illustrated in FIG. 2, a signal generator and receiver such as an external signal transceiver 275 is supported by the wafer carrier 160. In this position, the signal transceiver 275 is effectively shielded from the spray of deposition material impinging on the front surface 102 of the is wafer 100. Alternatively, the external signal transceiver 275 may be embedded within the wafer carrier 260. As a further specific embodiment, the wafer carrier 260 may include a channel 279 between the signal transceiver 275 and the semiconductor wafer 100 to reduce the effects of the structure of the wafer carrier 260 on the transmitted signal. A signal line 277 electrically couples the signal transceiver 275 to the controller 250. Details of the operation of the controller 250, the signal transceiver 258, the response circuit 170, and the signal transceiver 275 will be described below.

With either embodiment, namely the material deposition process shown in FIG. 2 or the material removal process shown in FIG. 3, the response circuit 170 is utilized to determine temperature of the semiconductor wafer 100 in-situ during a performance of a particular wafer fabrication process. In an exemplary embodiment, the response circuit 170 is a resonant circuit which has a known frequency response that varies as temperature of the wafer varies. In particular, in one embodiment, the resonant circuit 170 includes a resistive element or other component that is constructed of a thin metal film such as, for example, tungsten, titanium nitride, titanium salicide, or tungsten nitride. It should be appreciated that additional resonant circuits 170 may also be fabricated to include resistive elements constructed of diffused regions such as PWELL regions, NWELL regions, substrate regions, doped polysilicon, etcetera. The temperature coefficients of each type of resistive element may be accurately determined in advance of wafer processing, and depends on fundamental material properties thereby reducing, if not eliminating, variation of the temperature coefficient from wafer to wafer or across the same wafer. The resistance value of the resistive element determines the frequency response of the resonant circuit. Hence, as the wafer temperature varies, the properties of the resonant circuit 170 (i.e. the resistance of the resistive element) will likewise vary thereby producing a varying frequency response. Hence, by utilizing the temperature coefficient of the materials of which the resistive element is constructed, the temperature of the semiconductor wafer 100 may be accurately determined during fabrication thereof.

Accordingly, the processing units 154, 254 respectively associated with each of the controllers 150, 250 read and thereafter process an output signal generated by the response (i.e. resonant) circuit 170 (as received by the transceivers 158, 175, or 258, 275, respectively). In a specific embodiment, the external signal transceivers 175, 275 or the internal signal transceivers 158, 258 associated with the controllers 150, 250, respectively, are embodied as RF signal transceivers which (i) generate a magnetic field in the form of an RF interrogator signal that is specifically tuned to excite the response (i.e. resonant) circuit 170, and thereafter (ii) collect or otherwise receive the output response signal generated by the response circuit 170 as a result of excitation thereof. As discussed above, the output response generated by the response circuit 170 may be analyzed by the controllers 150, 250 in order to determine wafer temperature of the semiconductor wafer 100. It should be appreciated that the controllers 150, 250 may be operable to vary the frequency of the RF interrogator signal generated by the signal transceivers until it reaches the resonant frequency of the response circuit 170.

The controllers 150, 250 utilize predetermined frequency response values in order to correlate the actual frequency response generated by the response circuit 170 to a wafer temperature. In particular, the memory devices 156, 256 respectively associated with the processing units 154, 254 have store therein a number of frequency response values for each of the thin metal films which are utilized in the construction of a particular response circuit 170. For example, if the response circuit 170 associated with the first metal layer 114 is constructed of titanium nitride, the memory devices 156, 256 would have stored therein a number of frequency response values associated with a resonant circuit having a resistive element constructed of a thin film of titanium nitride. It should be appreciated that each of the frequency response values stored in the memory devices 156, 256 correlates to a wafer temperature that is determined by experimentation in advance of wafer fabrication based on the temperature coefficient of the material utilized in the construction of the resistive element. For example, it may be determined by experimentation in advance of wafer fabrication that a resonant circuit 170 having a resistive element constructed of titanium nitride generates a frequency response having a first value at one temperature, but generates a frequency response having a different, second value at a second temperature. Hence, once the actual frequency response from the response circuit 170 has been received by the signal transceivers, the processing units 154, 254 may compare the actual frequency response to the stored frequency response values in order to determine the wafer temperature of the semiconductor wafer 100 located within the deposition chamber 140 or the etching chamber 240.

In operation, the controller 150 monitors wafer temperature of the semiconductor wafer 100 during a material deposition process such as a chemical vapor deposition (CVD) process which deposits a wafer material such as a dielectric material on the wafer 100. In particular, the semiconductor wafer 100 is initially positioned in the wafer carrier 160 within the deposition chamber 140 by a wafer handling device or the like (not shown). Once positioned in the wafer carrier 160 within the deposition chamber 140, the controller 150 operates the material dispensing device 142 so as to produce a controlled, calibrated spray of wafer material which is directed onto the front side 102 of the semiconductor wafer 100. It should be appreciated that control signals from the controller 150 determine, amongst other things, the deposition rate of the wafer material, as well as the activation and deactivation of the dispensing device 142.

Contemporaneously with deposition of the wafer material, the controller 150 monitors wafer temperature of the semiconductor wafer 100 located within the deposition chamber 140. In particular, the controller 150 communicates with a signal transceiver in order to cause generation of a magnetic field in the form of an RF interrogator signal that is specifically tuned to excite the response circuit 170. As discussed above, the RF interrogator signal may be transmitted to the response circuit 170 via a wired connection (i.e. from the internal signal transceiver 158.via the signal line 167), or alternatively, may be transmitted via a wireless connection in which the external signal transceiver 175 generates the RF interrogation signal which is received by an antenna (not shown) associated with the response circuit 170. Excitation of the of the response circuit 170 causes the response circuit to generate an RF output response signal which is in turn received by the internal signal transceiver 158 associated with the controller 150 or the external signal transceiver 175. In particular, as with the RF interrogator signal, the RF output response signal generated by the response circuit 170 may be transmitted to the internal signal transceiver via a wired connection (i.e. from the response circuit 170 via the signal line 167), or alternatively, may be transmitted via a wireless connection which is received by an antenna (not shown) associated with the signal transceiver 175.

As described above, the frequency response of the response circuit 170 (i.e. the frequency associated with the output response signal generated by the response circuit 170 as a result of excitation thereof) varies based on the temperature coefficient of the material of which the resistive element is constructed. Hence, the processing unit 154 associated with the controller 150 compares the detected frequency response from the response circuit 170 to a number of frequency response values stored in the memory device 156. As described above, each of the frequency response values stored in the memory device 156 correlates to a wafer temperature (as determined by experimentation in advance of wafer fabrication). In this manner, the controller 150 may then directly determine the wafer temperature of the semiconductor wafer 100 located within the deposition chamber 140.

It should be appreciated that the controller 150 may be configured to perform numerous functions based on wafer temperature of the semiconductor wafer 100 within the deposition chamber 140. For example, if the measured wafer temperature exceeds a predetermined threshold, the controller 150 may deactivate the dispensing device 142 in order to cease material deposition onto the semiconductor wafer 100. Alternatively, if the measured wafer temperature exceeds the predetermined threshold, the semiconductor wafer 100 may be identified and thereafter subjected to additional quality control inspections in order to ensure that the wafer 100 has not been damaged. Moreover, the measured wafer temperature may simply be recorded in an electronic temperature log which tracks or otherwise monitors wafer temperatures. Yet further, the material deposition device 138 may be equipped with an environmental control device (not shown) which controls, amongst other things, the temperature within the deposition chamber 140. Based on the measured wafer temperature, the controller 150 may adjust operation of the environmental control device in order to maintain the wafer temperature of the semiconductor wafer 100 within certain predetermined parameters or specifications.

In somewhat of a similar manner, the controller 250 monitors wafer temperature of the semiconductor wafer 100 during a material removal process such as a plasma etching process which etches or otherwise removes wafer material such as dielectric or conductor material from the wafer 100. In particular, the semiconductor wafer 100 is initially positioned in the wafer carrier 260 within the etching chamber 240 by a wafer handling device or the like (not shown). Once positioned in the wafer carrier 260 within the etching chamber 240, the controller 250 operates the chemical distribution device 242 so as to release a chemical etching material into the etching chamber 240. In particular regard to when the wafer etching device 238 is embodied as a plasma etching device, the controller 250 then communicates with an electric field generating device (not shown) which generates an electric field within the etching chamber 240 thereby generating a plasma from the gas within the chamber 240 which selectively etches the front side 102 of the semiconductor wafer 100. It should be appreciated that control signals from the controller 250 determine, amongst other things, the removal rate of the wafer material, as well as the activation and deactivation of the chemical distribution device 242 and the electric field generator.

Contemporaneously with etching of wafer material, the controller 250 monitors wafer temperature of the semiconductor wafer 100 located within the etching chamber 240. In particular, the controller 250 communicates with a signal transceiver in order to cause generation of a magnetic field in the form of an RF interrogator signal that is specifically tuned to excite the response circuit 170 of the semiconductor wafer 100. As discussed above, the RF interrogator signal may be transmitted to the response circuit 170 via a wired connection (i.e. from the internal signal transceiver 250 via the signal line 267), or alternatively, may be transmitted via a wireless connection in which the external signal transceiver 275 generates the RF interrogator signal which is received by an antenna (not shown) associated with the response circuit 170. Excitation of the of the response circuit 170 causes the response circuit 170 to generate an RF output response signal which is in turn received by the internal signal transceiver 258 associated with the controller 250 or the external signal transceiver 275. In particular, as with the RF interrogator signal, the RF output response signal generated by the response circuit 170 may be transmitted to the internal signal transceiver via a wired connection (i.e. from the response circuit 270 via the signal line 267), or alternatively, may be transmitted via a wireless connection which is received by an antenna (not shown) associated with the signal transceiver 275.

As described above, the frequency response of the response circuit 170 (i.e. the frequency associated with the output response signal generated by the response circuit 170 as a result of excitation thereof varies based on the temperature coefficient of the material of which the resistive element is constructed. Hence, the processing unit 254 associated with the controller 250 compares the detected frequency response from the response circuit 170 to a number of frequency response values stored in the memory device 256. As described above, each of the frequency response values stored in the memory device 256 correlates to a wafer temperature (as determined by experimentation in advance of wafer fabrication). In this manner, the controller 250 may then directly determine the wafer temperature of the semiconductor wafer 100 located within the etching chamber 240.

It should be appreciated that the controller 250 may be configured to perform numerous functions based on wafer temperature of the semiconductor wafer 100 within the etching chamber 240. For example, if the measured wafer temperature exceeds a predetermined threshold, the controller 250 may deactivate the chemical distribution device 242 and/or the electric field generator in order to cease etching of the semiconductor wafer 100. Alternatively, if the measured wafer temperature exceeds the predetermined threshold, the semiconductor wafer 100 may be identified and thereafter subjected to additional quality control inspections in order to ensure that the wafer 100 has not been damaged. Moreover, the measured wafer temperature may simply be recorded in an electronic temperature log which tracks or otherwise monitors wafer temperatures. Yet further, the etching device 238 may be equipped with an environmental control device (not shown) which controls, amongst other things, the temperature within the etching chamber 240. Based on the measured wafer temperature, the controller 250 may adjust operation of the environmental control device in order to maintain the wafer temperature of the semiconductor wafer 100 within certain predetermined parameters or specifications.

It should be appreciated that although the concepts of the present invention have herein been described as being utilized to monitor wafer temperature during a deposition process and an etching process, and have significant advantages thereby, certain of such advantages may be realized by monitoring wafer temperature during other wafer fabrication processes. For example, wafer temperature may be monitored by utilizing the concepts of the present invention during a patterning process in which a circuit pattern or the like is patterned on the semiconductor wafer 100 with a patterning device such as a photolithographic stepper. Moreover, wafer temperature may be monitored by utilizing the concepts of the present invention during a planarization process in which the semiconductor wafer 100 is planarized with a planarizing device such as a chemical-mechanical polishing (CMP) system. Moreover, wafer temperature may be monitored by utilizing the concepts of the present invention during a doping process or a shallow trench isolation (STI) process.

While the invention has been illustrated and described in detail in drawings and the foregoing description, such illustration and description is to be considered exemplary and not restrictive in character, it being understood that only preferred embodiments have been shown and described and that all changes and modifications that come within the spirit of the invention are desired to be protected.

There are a plurality of advantages of the present invention arising from the various features of the wafer temperature monitoring concept described herein. It will be noted that alternative embodiments of the wafer temperature monitoring concept of the present invention may not include all of the features described yet still benefit from at least some of the advantages of such features. Those of ordinary skill in the art may readily devise their own implementations of the wafer temperature monitoring concept that incorporate one or more of the features of the present invention and fall within the spirit and scope of the present invention as defined by the appended claims.

What is claimed is:

1. A method of determining temperature of a semiconductor wafer during wafer fabrication, comprising the steps of:

providing a response circuit on said semiconductor wafer;

exciting said response circuit and measuring an output response thereof;

determining temperature of said semiconductor wafer based on said output response of said response circuit; and fabricating a circuit layer on said semiconductor wafer, wherein said exciting step is performed contemporaneously with said fabricating step.

2. The method of claim 1, wherein said providing step includes the step of providing a resonant circuit which has a resonant frequency which varies based on temperature of said semiconductor wafer.

3. The method of claim 2, wherein said exciting step includes the step of transmitting an RF interrogation signal to said response circuit.

4. The method of claim 3, wherein said exciting step further includes the step of measuring an RF output response of said response circuit.

5. The method of claim 1, wherein said fabricating step includes the step of changing thickness of said semiconductor wafer.

6. The method of claim 5, wherein said step of changing thickness of said semiconductor wafer includes the step of depositing material on said semiconductor wafer.

7. The method of claim 5, wherein said step of changing thickness of said semiconductor wafer includes the step of removing material from said semiconductor wafer.

8. A method of determining temperature of a semiconductor wafer during wafer fabrication, comprising the steps of:

providing a response circuit on said semiconductor wafer;

transmitting an interrogation signal with a signal transceiver so as to excite said response circuit;

receiving a response signal which was generated by said response circuit as a result of excitation thereof;

determining temperature of said semiconductor wafer based on said response signal; and fabricating a circuit layer on said semiconductor wafer, wherein both said transmitting step and said receiving step are performed contemporaneously with said fabricating step.

9. The method of claim 8, wherein said providing step includes the step of providing a resonant circuit which has a resonant frequency which varies based on temperature of said semiconductor wafer.

10. The method of claim 8, wherein said transmitting step includes the step of transmitting an RF interrogation signal to said response circuit.

11. The method of claim 8, wherein said receiving step includes the step of receiving an RF response signal which was generated by said response circuit as a result of excitation thereof.

12. A method of determining temperature of a semiconductor wafer during wafer fabrication comprising the steps of:

providing a resonant circuit which has a resonant frequency which varies based on temperature of said semiconductor wafer;

exciting said resonant circuit during wafer fabrication and measuring an output response thereof; and determining temperature of said semiconductor wafer during wafer fabrication based on said output response of said resonant circuit.

13. The method of claim 12, wherein said exciting step includes the step of transmitting an RF interrogation signal to said response circuit.

14. The method of claim 13, wherein said exciting step further includes the step of measuring an RF output response of said response circuit.

* * * * *